United States Patent
Nakamura et al.

(10) Patent No.: US 7,404,518 B2
(45) Date of Patent: Jul. 29, 2008

(54) CONTROLLER, CONTROL METHOD, AND PROGRAM

(75) Inventors: Junichi Nakamura, Chiba (JP); Shuichi Otsu, Kanagawa (JP); Mie Namai, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/417,150

(22) Filed: May 4, 2006

(65) Prior Publication Data

US 2006/0262089 A1 Nov. 23, 2006

(30) Foreign Application Priority Data

May 23, 2005 (JP) ............................. 2005-150150

(51) Int. Cl.
*G06K 5/00* (2006.01)
(52) U.S. Cl. .................. 235/382; 235/472.02
(58) Field of Classification Search ................. 341/175, 341/176; 348/14.05, 734; 235/382, 462.45, 235/472; 345/156, 157, 158, 168, 169, 173; 340/3.7, 3.71, 825.69, 825.72, 825.56, 825.22, 340/825.24, 825.25

See application file for complete search history.

(56) References Cited

U.S. PATENT DOCUMENTS

| 6,466,233 | B1 * | 10/2002 | Mitani ..................... 345/716 |
| 2004/0207766 | A1 * | 10/2004 | Sata et al. .................. 348/734 |
| 2006/0050142 | A1 * | 3/2006 | Scott et al. ............... 348/14.05 |

FOREIGN PATENT DOCUMENTS

JP 2002-333937 11/2002

OTHER PUBLICATIONS

Sony Integrated Remote Commander RM-NX7000 "Operating Instructions", Copyright 2004 by Sony Corporation. Relevant sections: Cover page and pp. 17-18.*

* cited by examiner

*Primary Examiner*—Daniel St.Cyr
(74) *Attorney, Agent, or Firm*—Oblon, Spivak, McClelland, Maier & Neustadt, P.C.

(57) ABSTRACT

A controller has a display unit for displaying commands used for controlling apparatuses, wherein the display unit includes a first area for displaying commands selected with a first operation unit and set with a second operation unit, and a second area for displaying commands selected and set at the same time with a third operation unit.

13 Claims, 6 Drawing Sheets

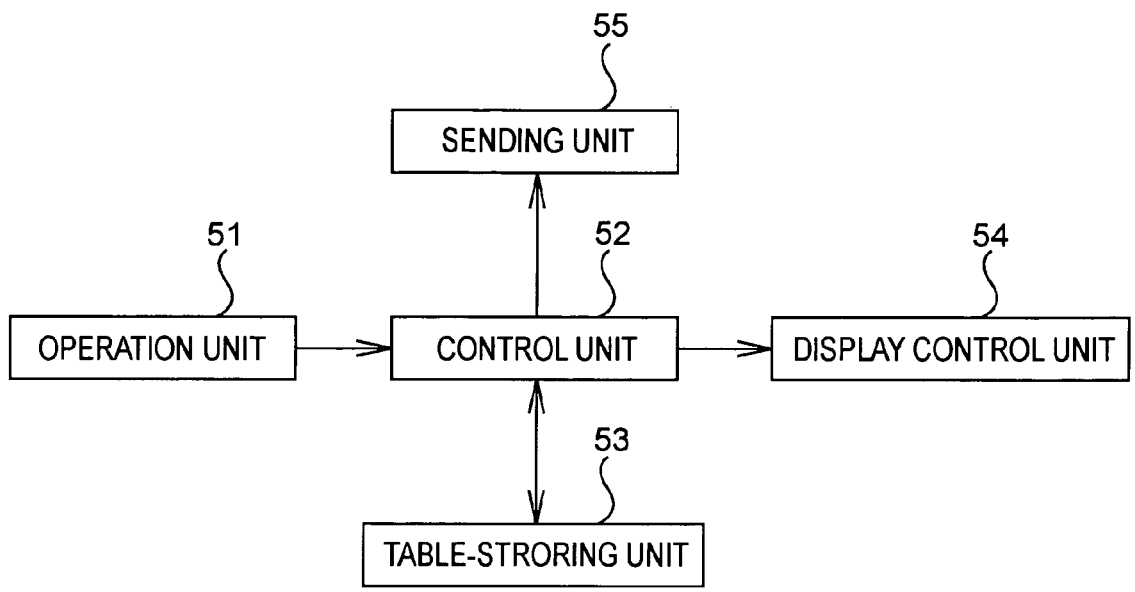

CONTROLLER, CONTROL METHOD, AND PROGRAM

CROSS REFERENCES TO RELATED APPLICATIONS

The present invention contains subject matter related to Japanese Patent Application JP 2005-150150 filed in the Japanese Patent Office on May 23, 2005, the entire contents of which are incorporated herein by reference.

BACKGROUND OF THE INVENTION

1. Field of the Invention

The present invention generally relates to controllers, control methods, and programs, and in particular, to a controller, a control method, and a program preferable for improving usability of a control operation of various electronic apparatuses.

2. Description of the Related Art

It is possible to remotely control various electronic apparatuses using controllers. For example, regarding an electronic apparatus such as a television receiver, operations, such as channel change and volume adjustment, are performed using a controller.

In addition, there are various kinds of electronic apparatuses. Each electronic apparatus has an operation unit suitable for enabling its operation. For each kind of electronic apparatus, various suggestions to improve its usability have been made (see, for example, Japanese Unexamined Patent Application Publication No. 2002-333937).

SUMMARY OF THE INVENTION

Many functions have been introduced to electronic apparatuses, such as television receivers. However, making all of the functions controllable with a controller leads to an increase in the number of operation buttons. As the number of buttons increases, the size of the controller also increases, which results in poor usability. Additionally, when many buttons are provided on the controller, it becomes harder to find a button used for performing a desired operation, which also contributes to poor usability.

In view of such disadvantages, the embodiments of the present invention implement an easier control operation for controlling various electronic apparatuses.

According to an embodiment of the present invention, a controller has displaying means for displaying commands used for controlling apparatuses, wherein the displaying means includes a first area for displaying commands selected with a first operation unit and set with a second operation unit, and a second area for displaying commands selected and set at the same time with a third operation unit.

In an operation unit including the first operation unit, the second operation unit, and the third operation unit, part of the operation unit may be assigned to the first operation unit and the second operation unit, and the rest may be assigned to the third operation unit.

The first operation unit may include components for causing a cursor, movable between the commands displayed in the first area, to move upward, downward, to the left, and to the right. The second operation unit may include a component to be operated to set a command at which the cursor is located. The third operation unit may include components, each corresponding to one of the commands displayed in the second area.

The first area and the second area may be of different sizes.

According to another embodiment of the present invention, a control method, for a controller having displaying means for displaying commands used for controlling apparatuses, includes the step of controlling the displaying means to display a first area for displaying commands selected with a first operation unit and set with a second operation unit, and to display a second area for displaying commands selected and set at the same time with a third operation unit.

According to further embodiment of the present invention, a computer readable program, for a controller having displaying means for displaying commands used for controlling apparatuses, enables a computer to execute a process including the step of controlling the displaying means to display a first area for displaying commands selected with a first operation unit and set with a second operation unit, and to display a second area for displaying commands selected and set at the same time with a third operation unit.

In the controller, control method, and program according to the embodiments of the present invention, the commands on which a selecting operation and a setting operation are separately performed and the commands on which the selecting operation and the setting operation are simultaneously performed are displayed on the same screen.

According to the embodiments of the present invention, the usability (operability) of the controller used for remotely controlling a predetermined electronic apparatus can be improved.

BRIEF DESCRIPTION OF THE DRAWINGS

FIG. 4 shows an example of a functional configuration of a controller;

FIG. 5 shows a table;

DESCRIPTION OF THE PREFERRED EMBODIMENTS

Embodiments of the present invention will be described below with reference to the accompanying drawings.

Figure 1:
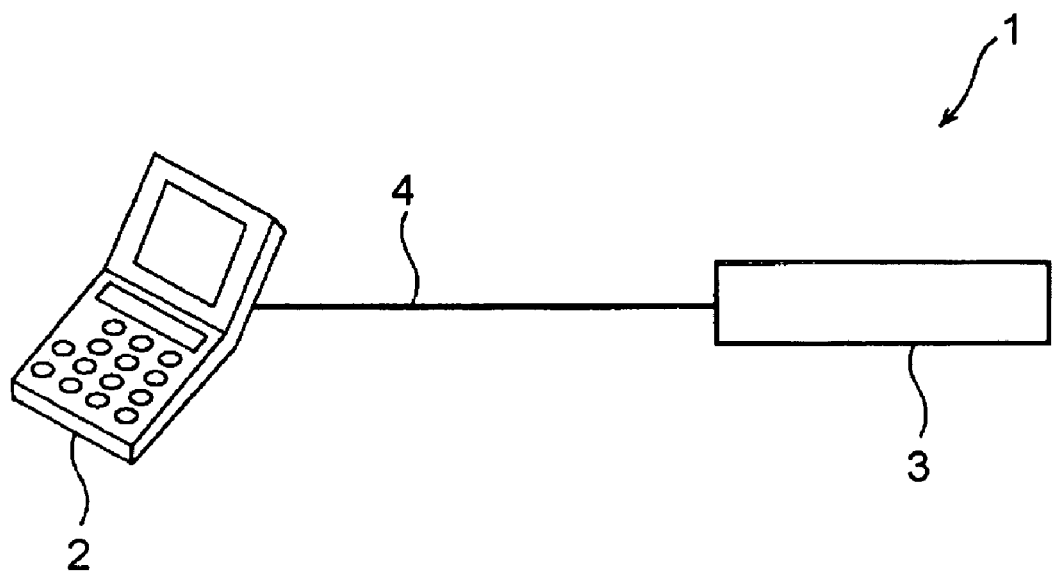
FIG. 1 shows a configuration of a system to which an embodiment of the present invention is applied.

FIG. 1 is a block diagram showing a configuration of a control system to which an embodiment of the present invention is applied.

Referring to FIG. 1, a control system 1 includes a controller 2, an electronic apparatus 3, and a network 4. The controller 2 and the electronic apparatus 3 are connected to each other through the network 4, and send and receive commands and responses.

The controller 2 is used to remotely control the electronic apparatus 3. As the electronic apparatus 3, for example, a television receiver, a hard disk recorder, or an air conditioner can be, but not exclusively, used. The network 4 may be constructed wirelessly or with wire. Alternatively, part of the network 4 may be constructed with wire and the rest wirelessly.

Figure 2:
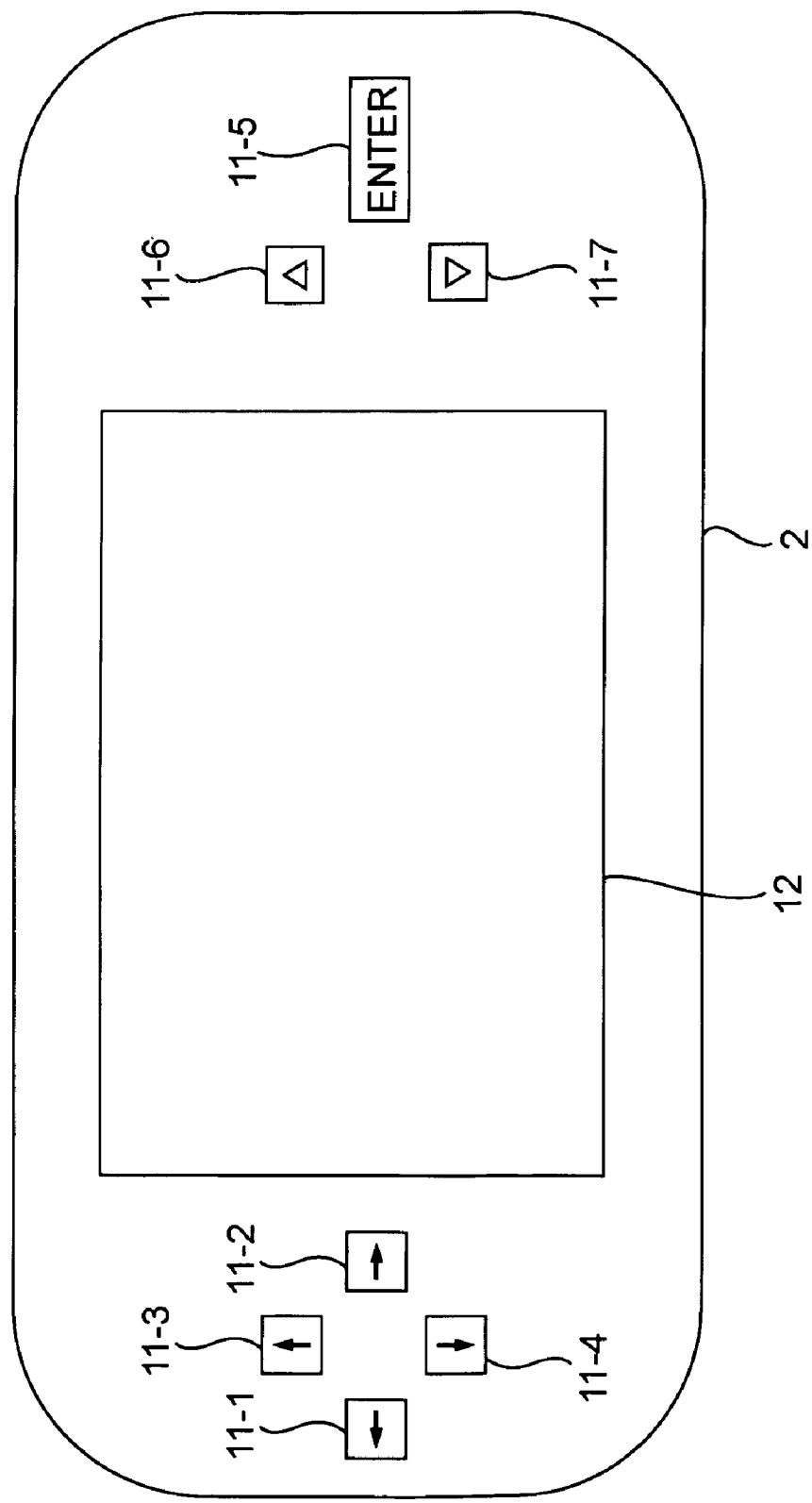
FIG. 2 shows an example exterior configuration of a controller.

FIG. 2 shows an example exterior configuration of the controller 2. The controller 2 has a plurality of buttons 11-1, 11-2, 11-3, 11-4, 11-5, 11-6, and 11-7 for receiving instructions from users. The controller 2 also has a display unit 12 for displaying information to the users. Hereinafter, the buttons 11-1 to 11-7 provided on the controller 2 can also be referred to as "an operation unit".

Although the detailed description will be given below, the buttons 11-1 to 11-4 are used for selecting operation items displayed on the display unit 12. A cursor displayed on the display unit 12 moves in response to the operation of these buttons. The button 11-5 is used for setting the operation item selected using the buttons 11-1 to 11-4. Hereinafter, a series of operations for selecting the operation items using the buttons 11-1 to 11-4 and setting the selected operation item using the button 11-5 can also be referred to as "a cursor operation".

The buttons 11-6 and 11-7 are used for selecting the operation items that are not selectable by the cursor operation. More specifically, without performing the series of the operations of selecting and setting the operation item by moving the cursor, the operation item can be selected and set at the same time by only operating the button 11-6 or 11-7. Hereinafter, this operation can also be referred to as "a direct operation".

Figure 3:
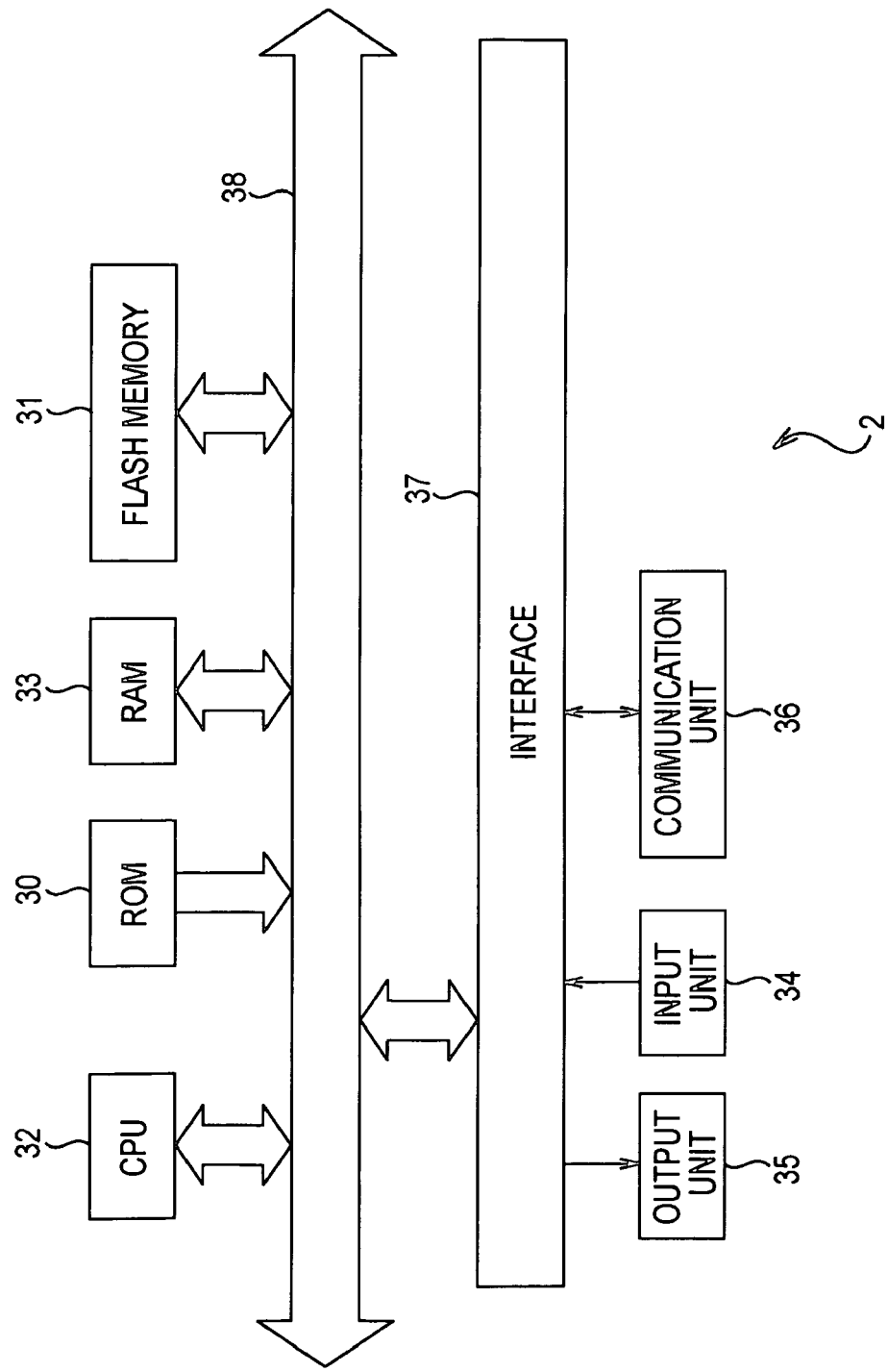
FIG. 3 shows an example internal configuration of a controller.

FIG. 3 is a block diagram showing an example internal configuration of the controller 2, shown in FIG. 1, according to an embodiment of the present invention.

The controller 2 includes a ROM (Read-Only Memory) 30, a flash memory (for example, EEPROM (Electronically Erasable and Programmable Read-Only Memory)) 31, a CPU (Central Processing Unit) 32, a RAM (Random-Access Memory) 33, an input unit 34, an output unit 35, a communication unit 36, an interface 37, and a bus 38. The input unit 34, the output unit 35, and the communication unit 36 are connected to the interface 37. The ROM 30, the flash memory 31, the CPU 32, the RAM 33, and the interface 37 are connected to each other through a bus 38.

The ROM 30 and the flash memory 31 store programs. The CPU 32 executes the programs to perform various kinds of processing. The flash memory 31 also stores a table (for example, a table of FIG. 5, which will be described later), having command sets (groups of commands), that has to be maintained even after turning off the controller 2. The RAM 33 stores the programs executed by the CPU 32 and necessary data accordingly.

The input unit 34 has a plurality of input keys, and is an interface used by users to input commands to the controller 2. In this example, as shown in FIG. 2, the input unit 34 includes the buttons 11-1 to 11-7.

The output unit 35 includes a display such as an LCD (Liquid Crystal Display), and displays control screens on the display unit 12 (shown in FIG. 2).

The communication unit 36 is a communication interface for performing, for example, wireless LAN (Local Area Network) communication based on IEEE (Institute of Electrical and Electronics Engineers) 802. The communication unit 36 communicates with the electronic apparatus 3 through the network 4 wirelessly or with a cable.

For example, when a user controls the electronic apparatus 3, the CPU 32 first reads out a command set corresponding to the electronic apparatus 3 from the command sets registered in the table stored in the flash memory 31, and supplies the command set to the output unit 35. The output unit 35 displays the control screen based on the supplied command set. Then, referring to the control screen, for example, the user operates the input unit 34 to select a command for controlling the electronic apparatus 3. The input unit 34 supplies the selected command to the communication unit 36 through the interface 37. The communication unit 36, in turn, sends the command to the electronic apparatus 3 through the network 4.

FIG. 4 is a block diagram showing an example functional configuration of the controller 2 shown in FIG. 1.

The controller 2 includes an operation unit 51, a control unit 52, a table-storing unit 53, a display control unit 54, and a sending unit 55. The operation unit 51 includes the buttons 11-1 to 11-7 shown in FIG. 2. The input unit 34 shown in FIG. 3 mainly implements the function of the operation unit 51. In response to the operation of the operation unit 51, a signal corresponding to the operated button out of the buttons 11-1 to 11-7 is supplied to the control unit 52.

The CPU 32 shown in FIG. 3 mainly implements the function of the control unit 52. Upon receiving the signal from the operation unit 51, the control unit 52 analyzes the signal, and identifies the operated button. Based on the determined result, the control unit 52 executes the corresponding processing.

The flash memory 31 shown in FIG. 3 mainly implements the function of the table-storing unit 53. The table-storing unit 53 stores a table (e.g., shown in FIG. 5) in which a plurality of commands for controlling electronic apparatuses is registered. A description of the table will be given later with reference to a drawing.

The display control unit 54 controls the screens displayed on the display unit 12 shown in FIG. 2. More specifically, the display control unit 54 performs controls for displaying the operation items (i.e., the control screens), used for operating the electronic apparatus 3, on the display unit 12.

The communication unit 36 shown in FIG. 3 mainly implements the function of the sending unit 55. Upon receiving the command selected and set by the user's operation of the operation unit 51, the sending unit 55 sends the command to the electronic apparatus 3 through the network 4.

FIG. 5 shows an example table stored in the table-storing unit 53. Categories of the electronic apparatuses to be controlled by the controller 2 and the command sets including the commands for the electronic apparatus are associated and registered in the table shown in FIG. 5.

In the table of FIG. 5, "television receiver" is registered in the category column. Corresponding to the category "television receiver", "television receiver command set" is registered. The "television receiver command set" includes all the commands, such as channel up, channel down, volume up, volume down, mute, and input selection, used for controlling all types of television receiver.

As shown in the example, when one category, i.e., "television receiver", is registered in FIG. 5, one kind of electronic apparatus 3 can be controlled. For example, when new functions are added to the television receiver, commands corresponding to the new functions are added to the command set registered in the table by rewriting (updating) the old command set.

Also, when the user buys a new television receiver, the command set stored in the table is updated to the command set for the new television receiver. Accordingly, the control operations of the new television receiver can be performed.

Thus, configuring the command set to be rewritable to new one allows the user to remotely control the electronic apparatus 3, even when the new functions are added to the target electronic apparatus 3 controlled by the controller 2 or the electronic apparatus 3 is replaced by a new one.

Additionally, a plurality of categories (for example, "television receiver", "DVD player", and "air conditioner") may be registered in the category column of the table. For each category listed in the category column, the corresponding command set may be registered in the command set column.

Accordingly, by registering the plurality of categories and the corresponding command sets in the table, a plurality of electronic apparatuses 3 of different types can be controlled using one controller 2. More specifically, for example, a step of reading out the command set corresponding to the target electronic apparatus 3 listed in the table stored in the table-storing unit 53 is added to a process executed by the control unit 52 of the controller 2. This enables control operations of the plurality of electronic apparatuses 3 using one controller 2.

Hereinafter, a description of processing executed in the controller 2 will be given with the assumption that the table shown in FIG. 5 is stored in the table-storing unit 53. Hence, in the description below, it is assumed that the television receiver is the target electronic apparatus 3 to be controlled by the controller 2.

Referring to a flowchart of FIG. 6, processing executed in the controller 2 will be described. As mentioned before, the controller 2 is a user interface used for controlling the electronic apparatus 3.

In response to an instruction given by the user, the control unit 52 (shown in FIG. 4) reads out the appropriate command set from the table stored in the table-storing unit 53 (at STEP S11). For example, when the user operates a predetermined one of the buttons 11-1 to 11-7 (shown in FIG. 2) of the operation unit 51, the processing at STEP S11 is executed.

The table-storing unit 53 may store a plurality of command sets for the plurality of electronic apparatuses (i.e., categories). In such a case, when the user selects the target electronic apparatus, the control unit 52 reads out the command set corresponding to the selected electronic apparatus (i.e., the selected category) from the table-storing unit 53.

Figure 7:
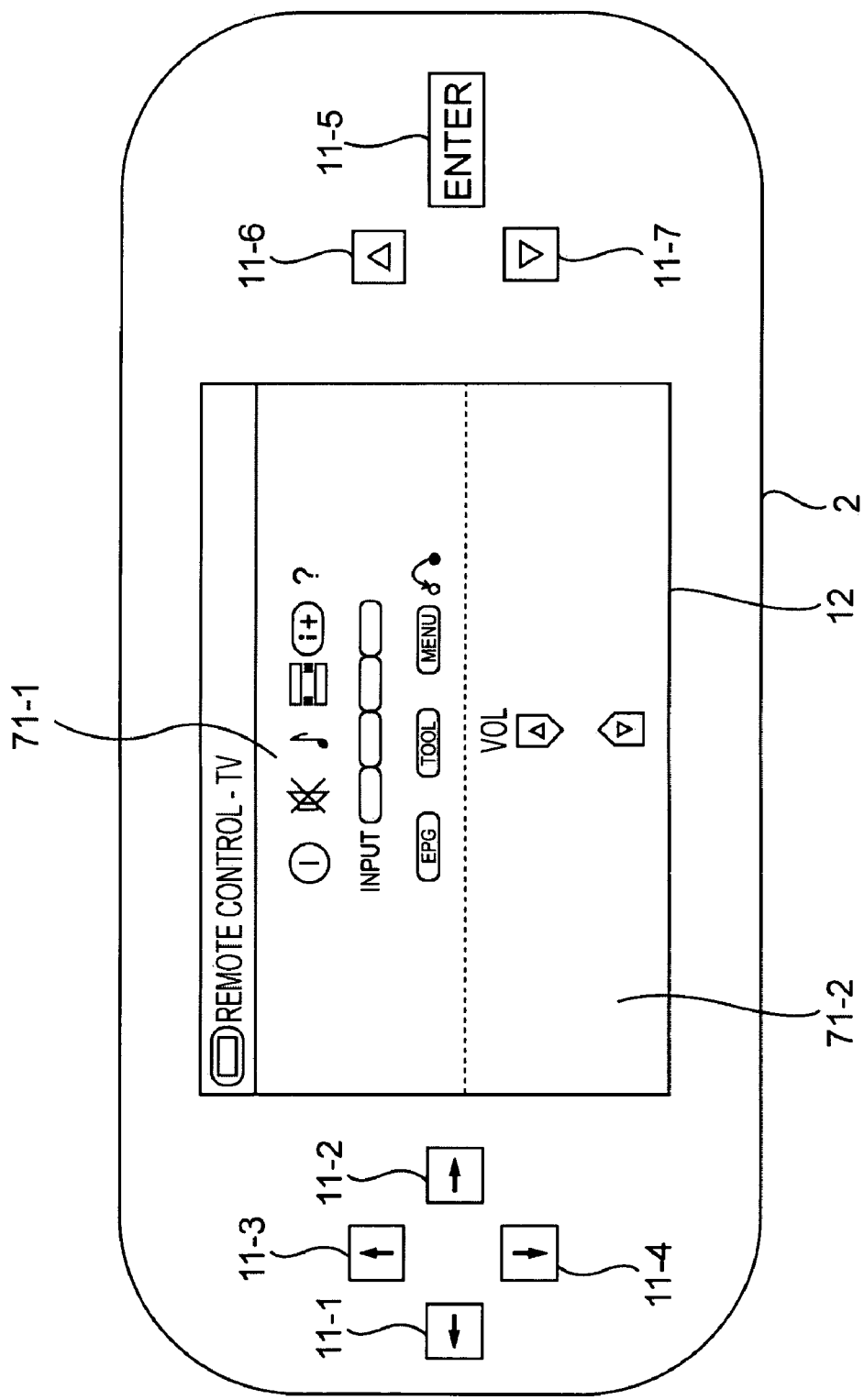
FIG. 7 shows a screen displayed on a display unit.

After creating data for the control screen based on the read out command set, the control unit 52 supplies the data to the display control unit 54 (at STEP S12). FIG. 7 shows an example control screen displayed on the display unit 12 under the control of the display control unit 54 (shown in FIG. 4) at STEP 12. The control screen shown in FIG. 7 is an example control screen displayed when the television receiver is remotely controlled.

As shown in FIG. 7, the control screen displayed on the display unit 12 includes a cursor operation display portion 71-1 and a direct operation display portion 71-2. That is, the control screen includes at least an area (i.e., a first area) for displaying the target commands (i.e., operation items) of the cursor operation and an area (i.e., a second area) for displaying the target commands of the direct operation.

In the cursor operation display portion 71-1, the commands selectable by the cursor operation are displayed. The target commands of the cursor operation include a plurality of commands for instructing operations such as mute, input selection, acquisition (or display) of EPG (Electronic Program Guide).

The command at which the cursor is located is displayed in a different manner from the other commands displayed in the cursor operation display portion 71-1 so as to distinguish the selected command. For example, the command with the cursor may be displayed brighter than the others, in a different color, or having an arrow-shaped cursor located thereover.

The cursor is configured to move between the displayed commands (i.e., operation items) in accordance with the operation of the buttons 11-1 to 11-4. When the user operates the button 11-1, the cursor moves to the left on the screen. Likewise, operating the buttons 11-2, 11-3, and 11-4 causes the cursor to move to the right, upward, and downward, respectively. That is, the buttons 11-1 to 11-4 are provided on the controller 2 such that the arrangement of the buttons 11-1 to 11-4 and the moving direction of the cursor correspond to each other.

In order to select the command (i.e., operation item) that the user desires to execute from the commands displayed on the cursor operation display portion 71-1, the user operates the buttons 11-1 to 11-4 to move the cursor onto the desired command. After moving the cursor to the desired command, the user operates the "Enter" button 11-5 to set the selected command. Accordingly, the desired command is selected and set.

Thus, the commands displayed in the cursor operation display portion 71-1 are selected by the user's operation of a first operation unit having the buttons 11-1 to 11-4, and set by the user's operation of a second operation unit having a button 11-5.

On the other hand, the direct operation display portion 71-2 includes the commands set by the direct operation. The target commands of the direct operation are relatively frequently used, and include commands such as volume adjustment and channel change.

In the direct operation display portion 71-2 shown in FIG. 7, the commands regarding the volume adjustment (i.e., a volume up command and a volume down command) are displayed. By operating the button 11-6, the user can select and set the volume up command. Likewise, by operating the button 11-7, the user can select and set the volume down command.

Accordingly, operating the button 11-6 or 11-7 once directly causes the commands displayed in the direct operation display portion 71-2 to be executed.

That is, by operating a third operation unit having the buttons 11-6 and 11-7, the commands displayed in the direct operation display portion 71-2 are selected and set at a same time.

Figure 6:
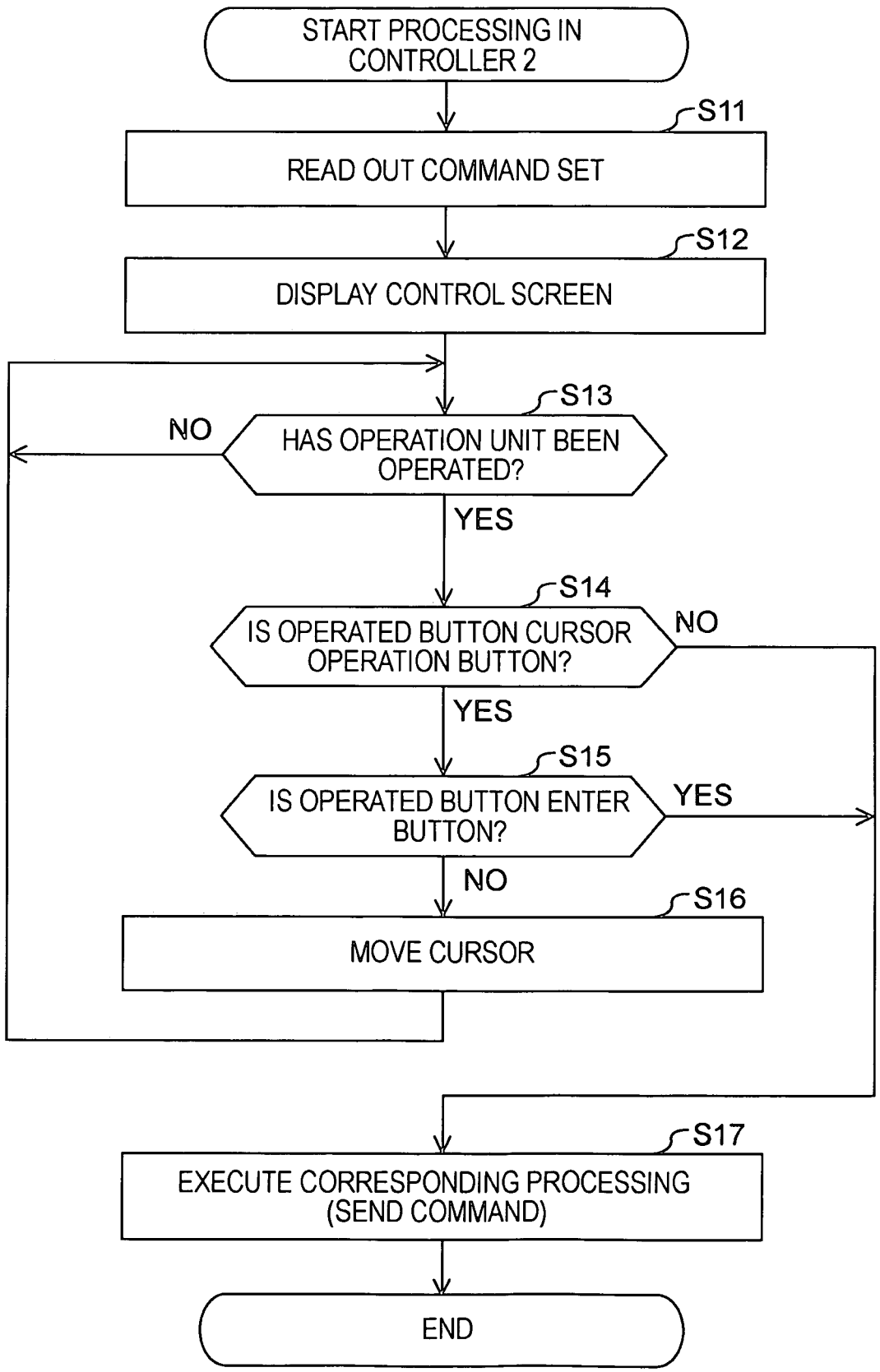
FIG. 6 is a flowchart illustrating processing executed in a controller.

Referring back to the flowchart of FIG. 6, after displaying the control screen shown in FIG. 7 as a result of the processing executed at STEP S12, the process proceeds to STEP S13.

The control unit 52 determines whether the operation unit 51 has been operated (at STEP S13). More specifically, the control unit 52 determines the presence or absence of a signal supplied from the operation unit 51 (at STEP S13). The controller 2 stands by until the control unit 52 determines that the operation unit 51 has been operated at STEP S13.

If the control unit 52 determines that the operation unit 51 has been operated at STEP S13, the process proceeds to STEP S14. The control unit 52 then determines whether the operated button is one of the buttons used for the cursor operation (hereinafter, referred to as "cursor operation buttons") or not (at STEP S14). More specifically, the control unit 52 determines whether the signal supplied from the operation unit 51 indicates the operation of one of the buttons 11-1 to 11-5 (shown in FIG. 7). The buttons 11-1 to 11-5 are provided to select and set the commands displayed in the cursor operation display portion 71-1.

If the control unit 52 determines that one of the cursor operation buttons has been operated (at STEP S14), the process proceeds to STEP S15. The control unit 52 then determines whether the "Enter" button (i.e., button 11-5) has been operated or not (at STEP S15). If the control unit 52 determines that the "Enter" button has not been operated, the process proceeds to STEP S16.

When one of the buttons 11-1 to 11-4 has been operated, the processing at STEP 16 is executed. Therefore, the cursor is moved in the direction according to the operated button (at STEP S16). After moving the cursor, the process returns to STEP S13, and the above-described steps are repeated. More specifically, the controller 2 stands by until the user performs the next operation. In response to the user's operation, the processing corresponding to the operation is executed.

On the other hand, if the control unit 52 determines that the operated button is the "Enter" button (i.e., the button 11-5) at STEP S15, the process proceeds to STEP S17.

The processing corresponding to the operated button is executed (at STEP S17). More specifically, a command signal for causing the electronic apparatus 3 (in this case, the television receiver) to execute the selected command is sent to the electronic apparatus 3. The selected command indicates the command at which the cursor is located when the "Enter" button is operated.

Suppose, for example, the button 11-5 (i.e., the "Enter" button) is operated while the cursor is located at the "mute" command (i.e., operation item). In such a case, the control unit 52 instructs the sending unit 55 to send the television receiver the signal for causing the television receiver to execute the "mute" command.

Accordingly, operating the buttons 11-1 to 11-4 causes the cursor to move, whereby the commands (i.e., operation items) displayed in the cursor operation display portion 71-1 are selected. By operating the button 11-5, the selected command is set. Then, the command signal corresponding to the set command is sent to the target electronic apparatus 3.

At STEP S14, if the control unit 52 determines that the cursor operation button has not been operated (i.e., that the button for the direct operation (button 11-6 or 11-7) is operated), the process proceeds to STEP S17.

The processing corresponding to the operated button is executed (at STEP S17). More specifically, a command signal for causing the electronic apparatus 3 (in this case, the television receiver) to execute the command corresponding to the operated button is sent to the electronic apparatus 3.

For example, when determining that the signal supplied from the operation unit 51 indicates the operation of the button 11-6, the control unit 52 instructs the sending unit 55 to send the command for turning up the volume to the electronic apparatus 3.

Accordingly, by operating the button 11-6 or 11-7, the commands (i.e., operation items) displayed in the direct operation display portion 71-2 are selected and set at the same time. Then, the command signal corresponding to the set command is sent to the target electronic apparatus 3.

According to the embodiment, as shown in FIG. 7, the cursor operation display portion 71-1 and the direct operation display portion 71-2 are displayed on the display unit 12 of the controller 2. The commands (i.e., operation items) displayed in the cursor operation display portion 71-1 are necessary for utilizing the functions of the electronic apparatus 3, but are used relatively infrequently. In contrast, the commands (i.e., operation items) displayed in the direct operation display portion 71-2 are necessary for utilizing the functions of the electronic apparatus 3, and are used relatively frequently.

Displaying the relatively frequently used commands and the relatively infrequently used commands in separate areas prevents these commands having different frequencies of use from being mixed up, thus allowing the user to easily find the frequently used commands, which ultimately improves the usability of the controller 2.

As described above, the user can select and set the frequently used commands with one operation of the button, which further improves the usability of the controller 2. In addition, the less frequently used commands are displayed in the same control screen as the frequently used commands. This permits the user to find the necessary command easily in the cursor operation display portion 71-1 without, for example, performing the predetermined complicated operations for displaying the less frequently used commands, even when the user desires to select one of the less frequently used commands.

The cursor operation display portion 71-1 (the first area) may be as large as the direct operation display portion 71-2 (the second area) as shown in FIG. 7. Alternatively, the size of these areas may be different. For example, since the commands displayed in the direct operation display portion 71-2 are more frequently used than those displayed in the cursor operation display portion 71-1, the frequently used commands may be displayed in the larger area for ease of recognition.

That is, an area for the direct operation display portion 71-2 may be configured to be larger than that of the cursor operation display portion 71-1.

Additionally, since the commands displayed in the cursor operation display portion 71-1 are used less frequently, it is not necessary to display these commands all the time. For example, a mechanism for displaying the less frequently used commands in the cursor operation display portion 71-1 in response to the operation of a predetermined button (e.g., one of the buttons 11-1 to 11-5) may be provided. When the commands are not displayed in the cursor operation display portion 71-1, only the commands in the direct operation display portion 71-2 are displayed on the control screen. Thus, at that time, the enlarged commands may be displayed in the direct operation display portion 71-2.

In the embodiment described above, as shown in FIG. 7, the volume up and down commands are displayed in the direct operation display portion 71-2. In addition, the buttons 11-6 and 11-7 are used to select and set these two commands.

Since the foregoing embodiment is described with the assumption that the target electronic apparatus is the television receiver, the buttons 11-6 and 11-7 are assigned to the volume adjustment. However, if the types of the target apparatuses are different, the buttons 11-6 and 11-7 (also the buttons 11-1 to 11-5) are assigned to the different commands corresponding to the target electronic apparatus. More specifically, the commands corresponding to the target electronic apparatus are displayed in the cursor operation display portion 71-1 and the direct operation display portion 71-2. Likewise, the commands corresponding to the target electronic apparatus are assigned to the buttons 11-1 to 11-7 (especially, buttons 11-6 and 11-7) in accordance with the displayed commands.

As described above, only using the buttons 11-1 to 11-4 for causing the cursor to move up and down and to the left and right to select the command and the button 11-5 for setting the command, the command displayed in the cursor operation display portion 71-1 is selected and set. That is, the user can select and set the commands displayed in the cursor operation display portion 71-1 with five buttons.

A controller of a video game machine may be used as the controller 2. In other words, the present invention can be applied to the controller of a video game machine. Recently, controllers of video game machines have had many (five or more) buttons.

Buttons other than those five buttons used for selecting and setting the commands displayed in the cursor operation display portion 71-1 may be used for selecting and setting the commands displayed in the direct operation display portion 71-2. Thus, as the number of buttons increases, the number of commands displayed in the direct operation display portion 71-2 increases. For example, in FIG. 7, only the volume adjustment commands are displayed. However, by displaying the channel change commands and assigning the channel change commands to buttons other than the buttons 11-1 to 11-7, the number of directly operable commands increases.

Therefore, the number of commands displayed in the direct operation display portion 71-2 can be altered (or set) in accordance with the number of buttons provided on the controller 2.

In this specification, the term "button" includes not only a pressable component but also a slidable component and a rotatable component to be operated. In addition, viewed from the user, the buttons 11-1 to 11-7 may be provided separately (i.e., each button is constituted by a separate component), for example, as shown in FIG. 7. Alternatively, from the user's viewpoint, an apparently single component such as, for example, a trackpad (i.e., a single component capable of moving the cursor and setting the command) may be provided as the button.

Furthermore, in this specification, the steps in a program, provided by a recording medium, include processing that is executed sequentially in the described order, and also includes processing that is executed in parallel or individually, not necessarily sequentially.

Moreover, in this specification, the term "system" indicates the entire equipment including a plurality of apparatuses.

It should be understood by those skilled in the art that various modifications, combinations, sub-combinations and alterations may occur depending on design requirements and other factors insofar as they are within the scope of the appended claims or the equivalents thereof.

What is claimed is:

1. A controller comprising:
   displaying means for displaying commands used for controlling apparatuses, wherein the displaying means includes
   a first area for displaying infrequently used commands selected with a first operation unit and set with a second operation unit, and
   a second area for displaying frequently used commands selected and set at the same time with a third operation unit,
   wherein the third operation unit includes components, each of which corresponds, respectively, to only one of the frequently used commands displayed in the second area.

2. The controller according to claim 1, wherein in an operation unit including the first operation unit, the second operation unit, and the third operation unit, part of the operation unit is assigned to the first operation unit and the second operation unit, and a remaining part is assigned to the third operation unit.

3. The controller according to claim 1, wherein
   the first operation unit includes components for causing a cursor, movable between the commands displayed in the first area, to move upward, downward, to the left, and to the right, and wherein
   the second operation unit includes a component to be operated to set a command at which the cursor is located.

4. The controller according to claim 1, wherein the first area and the second area are of different sizes.

5. The controller according to claim 1, further comprising:
   a memory configured to store at least a first command set for a first electronic apparatus and a second command set for a second electronic apparatus, the frequently used commands for the first electronic apparatus being different than the frequently used commands for the second electronic apparatus.

6. The controller according to claim 5, wherein the first electric apparatus is a television and a second electric apparatus is an air conditioner.

7. A control method for a controller having displaying means for displaying commands used for controlling apparatuses, the control method comprising:
   controlling the displaying means to display a first area for displaying infrequently used commands selected with a first operation unit and set with a second operation unit, and to display a second area for displaying frequently used commands selected and set at the same time with a third operation unit, the third operation unit including components, each of which corresponds, respectively, to only one of the frequently used commands displayed in the second area.

8. A computer readable medium including computer executable instructions, wherein the instructions, when executed by a processor, cause the processor to perform a method comprising:
   controlling the displaying means to display a first area for displaying infrequently used commands selected with a first operation unit and set with a second operation unit, and to display a second area for displaying frequently used commands selected and set at the same time with a third operation unit, the third operation unit including components, each of which corresponds, respectively, to only one of the frequently used commands displayed in the second area.

9. A control method for a controller having displaying means for displaying commands used for controlling apparatuses, the control method comprising:
   displaying, on the displaying means, a first area for displaying infrequently used commands selected with a first operation unit and set with a second operation unit, and a second area for displaying frequently used commands selected and set at the same time with a third operation unit, the third operation unit including components, each of which corresponds, respectively, to only one of the frequently used commands displayed in the second area;
   allowing a user to select one of the infrequently used commands displayed in the first area by operating the first operation unit;
   allowing the user to set the selected infrequently used command by operating the second operation unit; and
   allowing the user to select and set one of the frequently used commands displayed in the second area by operating the third operation unit.

10. A controller comprising:
    a display unit for displaying commands used for controlling apparatuses, wherein the display unit includes
    a first area for displaying infrequently used commands selected with a first operation unit and set with a second operation unit, and
    a second area for displaying frequently used commands selected and set at the same time with a third operation unit, the third operation unit including components, each of which corresponds, respectively, to only one of the frequently used commands displayed in the second area.

11. A control method for a controller having a display unit for displaying commands used for controlling apparatuses, the control method comprising:
    controlling the display unit to display a first area for displaying infrequently used commands selected with a first operation unit and set with a second operation unit, and to display a second area for displaying frequently used commands selected and set at the same time with a third operation unit, the third operation unit including components, each of which corresponds, respectively, to only one of the frequently used commands displayed in the second area.

12. A computer readable medium including computer executable instructions, wherein the instructions, when executed by a processor, cause the processor to perform a method comprising:

controlling the display unit to display a first area for displaying infrequently used commands selected with a first operation unit and set with a second operation unit, and to display a second area for displaying frequently used commands selected and set at the same time with a third operation unit, the third operation unit including components, each of which corresponds, respectively, to only one of the frequently used commands displayed in the second area.

13. A control method for a controller having a display unit for displaying commands used for controlling apparatuses, the control method comprising:

displaying, on the display unit, a first area for displaying infrequently used commands selected with a first operation unit and set with a second operation unit, and a second area for displaying frequently used commands selected and set at the same time with a third operation unit, the third operation unit including components, each of which corresponds, respectively, to only one of the frequently used commands displayed in the second area;

allowing a user to select one of the infrequently used commands displayed in the first area by operating the first operation unit;

allowing the user to set the selected infrequently used command by operating of the second operation unit; and allowing the user to select and set one of the frequently used commands displayed in the second area by operating the third operation unit.

* * * * *